United States Patent [19]

Krause

[11] 3,936,742
[45] Feb. 3, 1976

[54] APPARATUS FOR MEASURING ELECTRICAL QUANTITIES AT HIGH-VOLTAGE POTENTIAL
[75] Inventor: Dieter Krause, Berlin, Germany
[73] Assignee: Siemens Aktiengesellschaft, Munich, Germany
[22] Filed: Dec. 10, 1973
[21] Appl. No.: 423,172

[30] Foreign Application Priority Data
Dec. 11, 1972  Germany............................ 2261151

[52] U.S. Cl..................................... 324/96; 350/150
[51] Int. Cl.² ................... G01R 31/00; G01R 19/00
[58] Field of Search......................... 324/96; 350/150

[56] References Cited
UNITED STATES PATENTS
3,581,202  5/1971  Pelenc .................................. 324/96
3,810,013  5/1974  Müller ................................. 324/96

Primary Examiner—R. V. Rolinec
Assistant Examiner—Rolf Hille
Attorney, Agent, or Firm—Kenyon & Kenyon Reilly Carr & Chapin

[57] ABSTRACT

A device for measuring an electrical quantity at high-voltage potential includes a light-wave conductor for conducting light to a measuring sensor on the high-voltage side. A reflecting surface is arranged at the end of the measuring sensor that faces away from the light-wave conductor; this reduces the length of the light-wave conductor required. The light beam is reflected at the reflecting surface and leaves the light-wave conductor at low-voltage potential as a modulated light beam.

29 Claims, 12 Drawing Figures

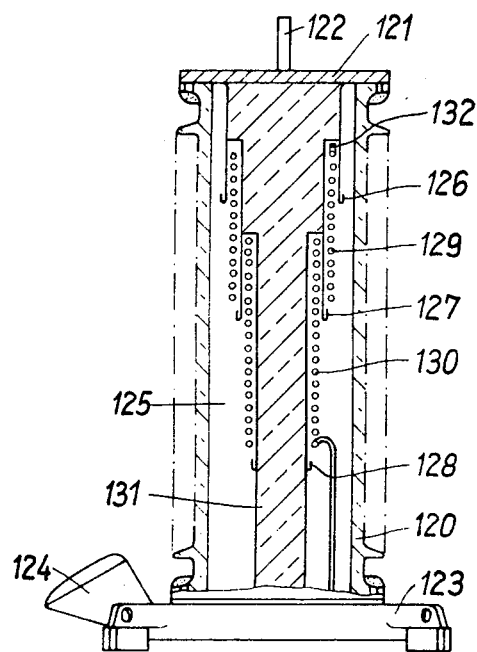

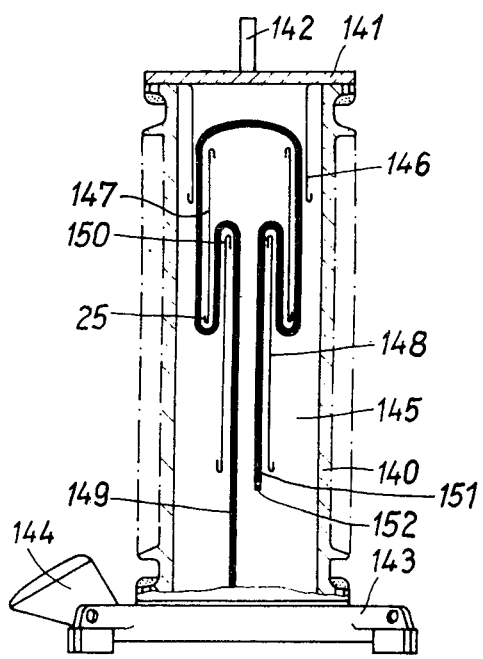

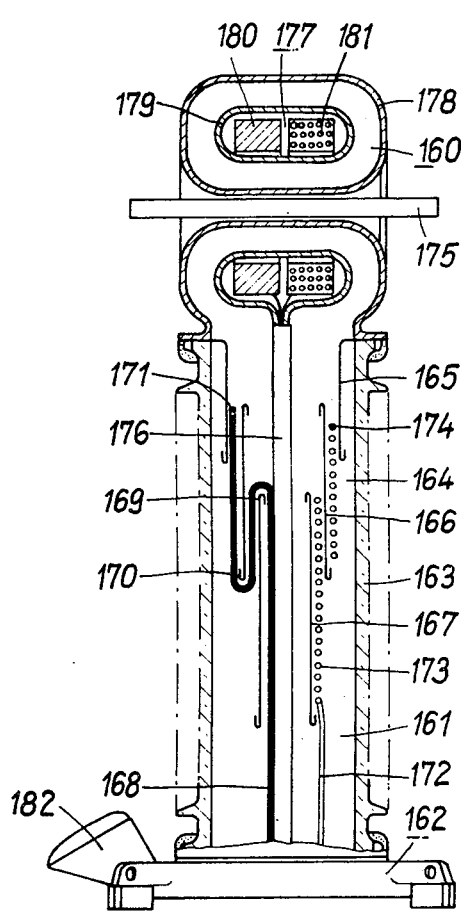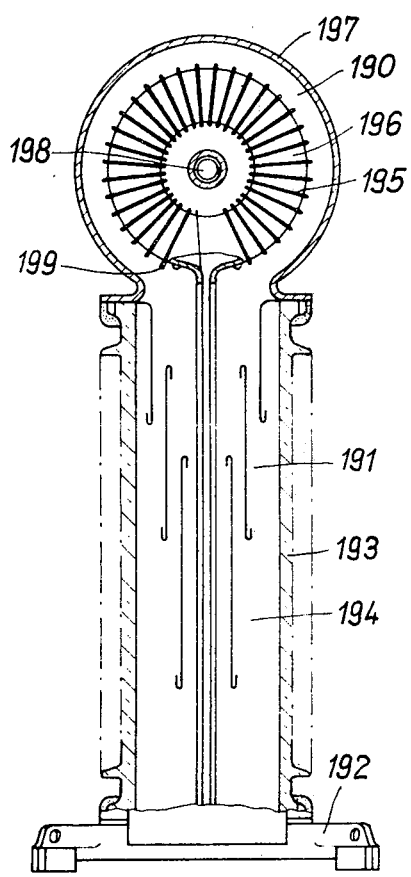

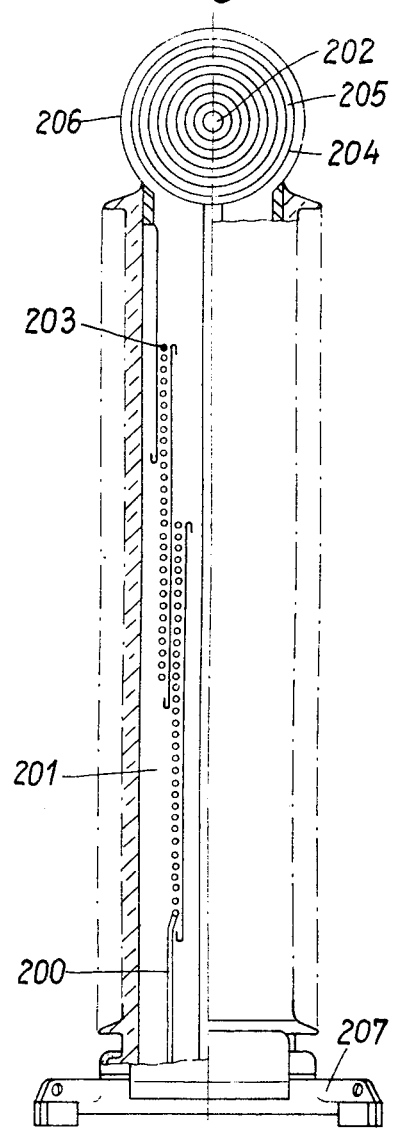

APPARATUS FOR MEASURING ELECTRICAL QUANTITIES AT HIGH-VOLTAGE POTENTIAL

BACKGROUND OF THE INVENTION

The invention relates to a measuring device with a measuring sensor of optically active material which is suitable for detecting an electrical measurement value at high-voltage potential. In conventional measuring devices of this type, polarized light is fed by means of a light-wave conductor to this material, and from this material, light with polarization changed according to the measurement value is fed to an evaluator device also by means of a further light conductor.

U.S. Pat. 3,605,013 discloses a measuring device of this type for measuring a current in a high-voltage conductor. The measuring sensor of this device is formed by a coil of a light-wave conductor and the ends of the coil constitute a light-wave conductor for feeding the polarized light to the measuring sensor as well as a further light-wave conductor for feeding the light, with the polarization changed according to the measurement value, to an evaluator device at low-voltage potential.

The known measuring device has the drawback that it requires a relatively great length because the light-wave conductor not only forms the measuring sensor, but the distance between the high-voltage and the low-voltage potentials is bridged by the light-wave conductor twice. Light-wave conductors of the required length are difficult to fabricate and are, furthermore, very expensive which, with the great length thereof, greatly affects the manufacturing costs.

SUMMARY OF THE INVENTION

It is, therefore, an object of the invention to provide a measuring apparatus which utilizes a light-wave conductor of relatively short length and can therefore be manufactured at a reasonably low cost.

The object of the invention is realized in a measuring device of the kind described above by the omission of the other light-wave conductor and by providing as a feature of the invention reflecting means in the form of a reflecting surface at the side of the measuring sensor which faces away from the one light-wave conductor as well as by an optical device preceding the last-mentioned light-wave conductor by means of which the light is fed to the light-wave conductor and the light, with its polarization changed according to the measurement value, is directed from the light-wave conductor onto the evaluator device. In the measuring device according to the invention, only a single light-wave conductor is arranged between the measuring sensor and the light source emitting the polarized light as well as the evaluator device, whereby the length of the light-wave conductor is halved as compared to the known measuring device.

In the measuring device according to the invention the reflecting surface at the measuring sensor can be formed in different ways. It appears to be advantageous to form the reflecting surface by a mirrored surface of the measuring sensor.

Under certain circumstances it may also be advantageous if the reflecting surface is formed by a mirror which is arranged on the side of the measuring sensor that is facing away from the light-wave conductor.

The measuring sensor in the measuring apparatus according to the invention may consist of a component with magneto-optical or electro-optical properties.

It is considered as particularly advantageous if the measuring sensor consists of a coil of light-wave conductor. In a measuring sensor configured in this manner, the light traverses the light-wave conductor of the measuring sensor twice and is therefore exposed to the electric or magnetic field, which is dependent upon the value measured, twice as much as in the known measuring device; for the same sensitivity, the measuring sensor therefore requires only a light-wave conductor half as long.

The invention can be used to advantage in a measuring apparatus for large currents and for currents in high-voltage conductors. In such an apparatus, the coil of light-wave conductor is arranged so that the conductor carrying the current to be measured is passed through the winding formed by the light-wave conductor.

The invention can also be applied in an apparatus for measuring voltages of high-voltage conductors; this is achieved by configuring the light-wave conductor as a coil which is arranged in an electric field caused by the voltage to be measured. The high-voltage conductor passes through the coil which consists of a relatively short light-wave conductor.

In both measuring apparatus the coil formed by the light-wave conductor is advantageously made so that its end extends to the evaluator circuit at low-voltage potential.

The invention can also be used to advantage in a measuring apparatus for measuring currents in high-voltage conductors in completely insulated, metal-encapsulated high-voltage switching installations. In this embodiment, the turns of the coil of light-wave conductor are arranged at the inside surface of the outer tube of the installation in the direction of the circumference and the coil is equipped with a shielding ring at its inside surface facing the high-voltage conductor, so that the electric field strength inside the tube of the high-voltage switching installation can have no influence on the rotation of the plane of polarization.

The advantages described above hold also if the invention is used in an arrangement for measuring voltages on high-voltage conductors, in which the coil of light-wave conductor is disposed in a non-controlled high-voltage insulator in such a manner that its longitudinal axis extends in the direction of the axis of the high-voltage insulator.

High-voltage insulators are understood here to be insulating arrangements of the support type as well as the feed-through type, for example, also the bushing of a power transformer or the supporting insulator of a power circuit breaker or disconnect switch.

In many cases preference will be given to an apparatus according to the invention wherein the coil of light-wave conductor is disposed in a high-voltage insulator with embedded control electrodes; in such an insulator the coil is arranged advantageously between adjacent control electrodes. So that in such a configuration, the dimensions of the high-voltage insulator can be made the same as usual, it is advantageous to dispose the layers of the coil of light-wave conductor between the individual control electrodes, that is, to subdivide the coil into individual layers which are then situated in the insulator displaced according to the arrangement of the control electrodes. The individual layers are connected with each other by a light-wave conductor and are advantageously wound from a continuous light-wave conductor. In such an embodiment of the apparatus of the invention, the individual layers of the coils of light-wave conductor are thus, as a rule, disposed concentrically about the axis of the high-voltage insulator.

As an alternate embodiment of the one just discussed above, it is possible and also advantageous to run the light-wave conductor of the measuring sensor in a high-voltage insulator with imbedded control electrodes, the light-wave conductor being run such that it extends along the control electrodes and is brought through in between the respective control electrodes. With such a configuration of the light-wave conductor, the latter therefore includes parts which run parallel to the longitudinal axis of the high-voltage insulator and are arranged so that the lines of force of the electric field pass transversely through the light-wave conductor. In this case, one thus obtains a meander-like configuration of the light-wave conductor in the high-voltage insulator.

In a case wherein the light-wave conductor is made of a material that yields only a small rotation of the plane of polarization as a function of the voltage to be measured, it appears advantageous to wind the light-wave conductor of the measuring sensor around the individual control electrodes so as to form several connected toroidal coils. A considerably greater length of the light-wave conductor is then exposed to the electric field and a larger rotation of the plane of polarization is achieved; this is advantageous for attaining greater measuring accuracy.

The foregoing already indicates that the invention can be applied to many configurations of high-voltage insulators. This applies also to a high-voltage insulator with wound capacitors as the voltage-controlling elements; in such an insulator, the light-wave conductors of the measuring sensor are preferably wound in with the capacitors. In a high-voltage insulator with plate or disc capacitors the light-wave conductor is arranged between the electrodes of the capacitors.

The invention can further be applied to a combined measuring transformer consisting of a current transformer unit and a voltage transformer unit wherein the coil of light-wave conductor is located in an electric field in the housing caused by the voltage and/or in the feed-through arrangement in such a manner that the plane of polarization of light passing through the light-wave conductor is rotated by an amount dependent on the magnitude of the voltage.

With such a construction of a combined measuring transformer, a conventional current transformer, for instance, can be made into a combination measuring transformer without appreciable constructional changes because the light-wave conductor acting as the measuring sensor can be arranged in regions of the transformer, which must remain unutilized for reasons of insulation, or which serve to form a dielectric. Because a light-wave conductor consists of insulating material, it can be disposed in these regions without disturbing the operation.

The coil of light-wave conductor is preferably arranged in an uncontrolled feed-through arrangement in such a manner that its longitudinal axis extends in the direction of the axis of the feed-through arrangement. The lines of the electric field, which extend between the electrode at high voltage and ground potential, are then utilized for rotating the plane of polarization. This, however, presumes that the coil of light-wave conductor in question is not subjected to interference fields. This assumption will in general be fulfilled in very high-voltage installations, as there the separation of the phases is relatively great.

In many cases preference will be given to an embodiment of the transformer according to the invention wherein the coil of the light-wave conductor is disposed in a feed-through arrangement with imbedded control electrodes; in such a feed-through arrangement, the coil is advantageously arranged between adjacent control electrodes. So that one can make the dimensions in such a configuration of the feed-through arrangement as is customary, it is advantageous to dispose the layers of the coil of light-wave conductor between the individual control electrodes, that is, to subdivide the coils into individual layers which are then located in the feed-through device displaced relative to each other in correspondence to the arrangement of the control electrodes. The individual layers are connected with each other by a light-wave conductor and are advantageously wound of a continuous light-wave conductor. In such an embodiment of the measuring transformer according to the invention, the individual layers of the coils of light-wave conductor are thus, as a rule, disposed concentrically about the axis of the feed-through arrangement.

The invention can be applied to combination transformers with widely different feed-through arrangements. This is true also for a feed-through device with wound capacitors as the voltage-controlling elements; in such a feed-through device, the light-wave conductors of the measuring sensor are preferably wound in with the capacitors. In a feed-through device with plate or disc capacitors the light-wave conductor of the measuring sensor is arranged between the electrodes of the capacitors.

To obtain a combination measuring transformer in accordance with the invention, it is not only possible to arrange the light-wave conductor inside the feed-through arrangement, but the barrel or head structure of the transformer can also be used to accommodate the light-wave conductor for the purpose of measuring voltage. The head structure can include a conducting, annular shell for receiving the current-measuring unit and a head housing surrounding this shell. This arrangement can be configured in such a manner that the light-wave conductor of the measuring sensor is arranged and run between the shell and the head housing in such a way that the lines of the electric field pass through it transversally. The light-wave conductor can be run here in different ways; for instance, it can enclose the annular shell at its outer circumference. However, it appears to be more advantageous if the light-wave conductor is wound around the annular shell so that it forms a toroidal coil.

The current-measuring unit located in the housing of a head structure can likewise be arranged and configured in different ways; for instance, in a transformer of the head type of construction, a conventional secondary winding with an iron core can be accommodated in the annular shell. By means of such a current-measuring unit, current measurements for accounting purposes can then be performed.

It is particularly advantageous to provide at least one coil of a light-wave conductor in the annular shell of the head structure such that the plane of polarization of polarized light passing through this coil is rotated as a function of the magnitude of the current in the primary conductor. In this manner, information regarding the line current can be obtained. This information is obtained for very small operating currents as well as for the largest short-circuit currents without the disadvantages associated with conventional current transformers with iron core, namely, that of distortion caused by possible saturation phenomena.

If provision for conventional current measurement for accounting purposes is not necessary, the possibility exists to form the current-measuring unit of one of several windings of light-wave conductor and to bring the primary conductor through the windings, so that the plane of polarization of polarized light going through the light-wave conductor is rotated as a function of the current in the primary conductor. With several light-wave conductor windings, several possible overlapping current-measuring ranges can be obtained with great accuracy. In this connection, in the measuring range for operating currents, the measurement for accounting purposes is important, and in the measuring range for short-circuit currents, the measurement for protection purposes is important. If the windings of light-wave conductor are cast-in and provided with a conductive outer coating, the light-wave conductor is completely shielded and is exposed exclusively to the magnetic field which is produced by the current in the primary conductor. The rotation of the plane of polarization of the light in these windings is then exclusively a measure of the current through the primary conductor.

In one embodiment of the combination measuring transformer according to the invention with one or several windings of light-wave conductor for current measurements, an additional evaluator device is provided at the low-voltage potential, in which the rotation of the plane of polarization of the light is converted into an electrical, digital or analog measurement quantity proportional to the current in the primary conductor.

Although the invention is illustrated and described herein as apparatus for measuring electrical quantities at high-voltage potential, it is nevertheless not intended to be limited to the details shown, since various modifications may be made therein within the scope and the range of the claims. The invention, however, together with additional objects and advantages will be best understood from the following description and in connection with the accompanying drawings.

BRIEF DESCRIPTION OF THE DRAWINGS

FIG. 8 is an elevation view showing how a coil made of a light-wave conductor can be arranged in a high-voltage insulator for measuring voltage.

FIG. 9 illustrates an alternate arrangement of the light-wave conductor within the high-voltage insulator.

FIGS. 10 to 12 illustrate embodiments of the invention wherein measuring sensors are arranged to measure both current and voltage.

DESCRIPTION OF THE PREFERRED EMBODIMENTS OF THE INVENTION

Figure 1:
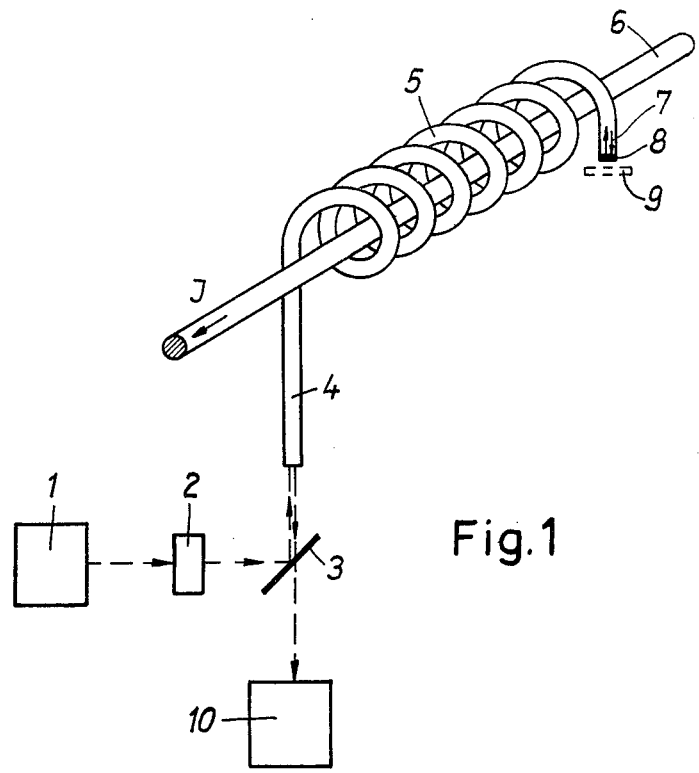
FIG. 1 is a perspective schematic diagram of the measuring apparatus according to the invention wherein the measuring sensor is made of a light-wave conductor and is arranged with respect to a high-voltage line on which it is desired to make measurements.

In the embodiment of FIG. 1, light is directed from a light source 1 through a polarizer 2 onto an optical device which consists of a semitransparent plate 3. From the plate 3, the polarized light gets into a light-wave conductor 4 which becomes a coil 5. The light-wave conductor 4, 5 can be made of optical fiber material. Suitable light-wave conductors which can be used are index-gradient conductors, gradient fibers and such light conductors which can conduct polarized light rays without disrupting the polarization of the light. A suitable light-wave conductor is described in the German periodical "Laser und angewandte Strahlentechnik," 1971, No. 2, pages 39 – 41. The polarizer may also be arranged between the semitransparent plate and the light-wave donductor. A high voltage conductor 6 passes through the coil 5. The current J to be measured flows through the conductor 6. The coil 5 is provided at its end 7 with reflecting means, for example, a mirror surface 8. Instead of applying a mirror coating to the end of the coil, a mirror 9 may be arranged, as shown by broken lines.

The polarized light passes through the light-wave conductor 4 and a measuring sensor in the form of the coil 5 wherein a rotation of the plane of polarization as a function of the current J takes place. The light beam is reflected at the end 7 of the coil 5 and passes once more through the coil 5 whereby a further rotation of the plane of polarization occurs.

The light with its plane of polarization rotated leaves the light-wave conductor 4, passes through the semitransparent plate 3 and gets into the evaluator device 10. The device can be built in a manner known per se and can function, for example, according to the null method.

Figure 2:
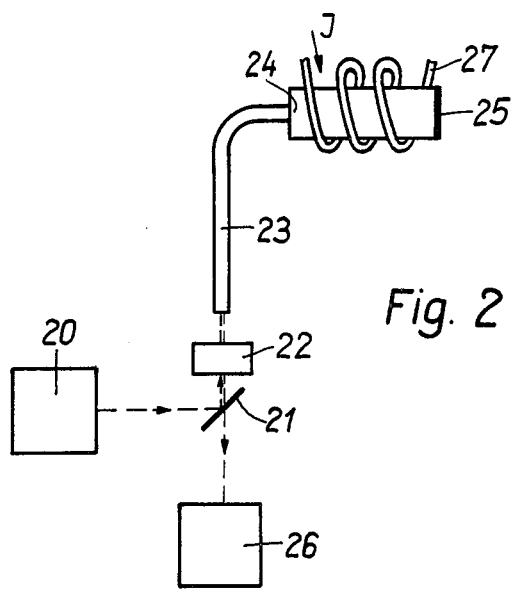
FIG. 2 illustrates an embodiment of the invention wherein a measuring sensor is provided having magneto-optical characteristics.

In the embodiment of FIG. 2, light of a light source is directed via a semitransparent plate 21 onto a polarizer 22, where it is polarized. After the polarizer 22, the light enters a light-wave conductor 23, which feeds the light, without changing its plane of polarization, to a component 24 with magneto-optical properties such as a Faraday body. Component 24 can be made, for example, of Yttrium Iron Garnet. The light goes through the component 24 and is reflected at a mirror surface 25, so that it gets back into the light-wave conductor 23 and enters from there the evaluator device 26 via the semitransparent plate 21. The component 24 is surrounded by an electric coil 27, through which the current to be measured J, or a current proportional to the current to be measured, flows.

Figure 3:
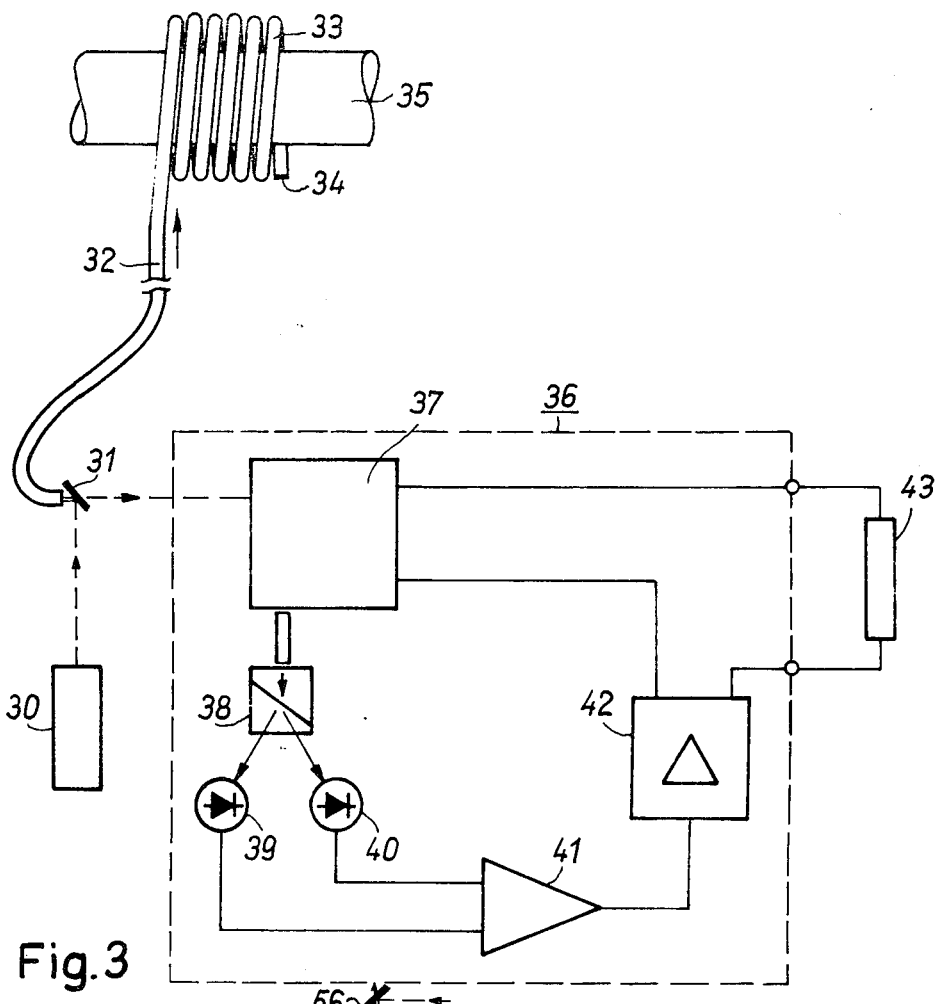
FIG. 3 is a schematic diagram showing an embodiment of the invention suitable for measuring current. Also shown in this view, is a block-schematic diagram of the evaluation device of the measuring apparatus.

In the embodiment of FIG. 3 of the measuring device of the invention, linearly polarized light is sent from a light source 30 arranged at low-voltage potential to a coil 33 of light-wave conductor via a semitransparent plate 31 and a light-wave conductor 32. The light source 30 can be a laser for example. The coil made of a light-wave conductor is configured so that one of its ends forms the light-wave conductor 32; the other end of the coil 33 carries a mirror surface 34.

The plane of polarization of the light is rotated in the coil 33 as a function of the current which flows, for instance, in a high-voltage conductor 35; this high-voltage conductor 35 extends through the coil 33, so that a magnetic field component acting in the longitudinal direction becomes effective in the light-wave conductor of the coil. This component of the magnetic field causes a rotation of the plane of polarization of the light, the rotation being proportional to the magnitude of the current in the high-voltage conductor to be measured.

Evaluation means in the form of an evaluator device 36 is provided wherein a magneto-optical modulator 37 is provided wherein the plane of polarization of the light is rotated back. For this purpose, the modulator 37 is followed by an analyzer prism 38, in which the light coming from the modulator 37 is split into two component light beams having respective polarization planes perpendicular to each other and having respective intensities that change in opposition relative to each other in proportion to the angle of rotation of the polarization plane of the incident beam. Both component light beams are fed to photo diodes 39 and 40, respectively, which are followed by a differential amplifier 41. The analyzer prism and the photo-cells conjointly constitute transducer means. To the differential amplifier 41 is connected an output amplifier 42 which, via a load 43, supplies the magneto-optical modulator 37 in each case with such a current that the rotation of the plane of polarization that took place at high-potential in the coil 33 is cancelled in the magneto-optical modulator 37 of the evaluator circuit 36. The load 43 is comparable to the usual load of current transformers and can therefore be realized by a measuring device or a system protection device.

Figure 4:
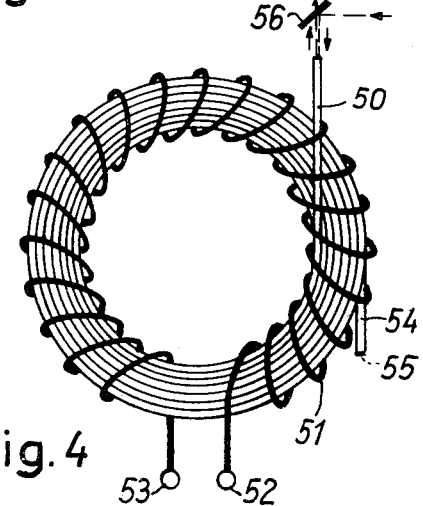
FIG. 4 is a schematic diagram showing a modulator of the type utilized in the evaluating device shown in FIG. 3, for example.

The magneto-optical modulator 37 according to FIG. 3 can be constructed in the manner shown in FIG. 4. It will be seen there that a light-wave conductor 50 is wound up into a winding which is surrounded by a further winding 51 of an electric conductor. To the ends 52 and 53 of the winding 51 are connected, for instance, one lead of the load 43 and one output of the amplifier 42 according to FIG. 3. The current delivered by the amplifier, which flows through the winding 51, produces in the winding formed by the light-wave conductor 50 a magnetic field which cancels, due to the configuration of the evaluator circuit 36, the rotation of the plane of polarization in the coil 33 at high-voltage potential. The current flowing through the winding 51 and the load 43 is then proportional to the current to be measured in the high-voltage conductor 35. The winding of the light-wave conductor 50 is provided at its end 54 with a mirror surface 55, at which the light beam is reflected. The other end of the winding is preceded by a semitransparent plate 56.

Figure 5:
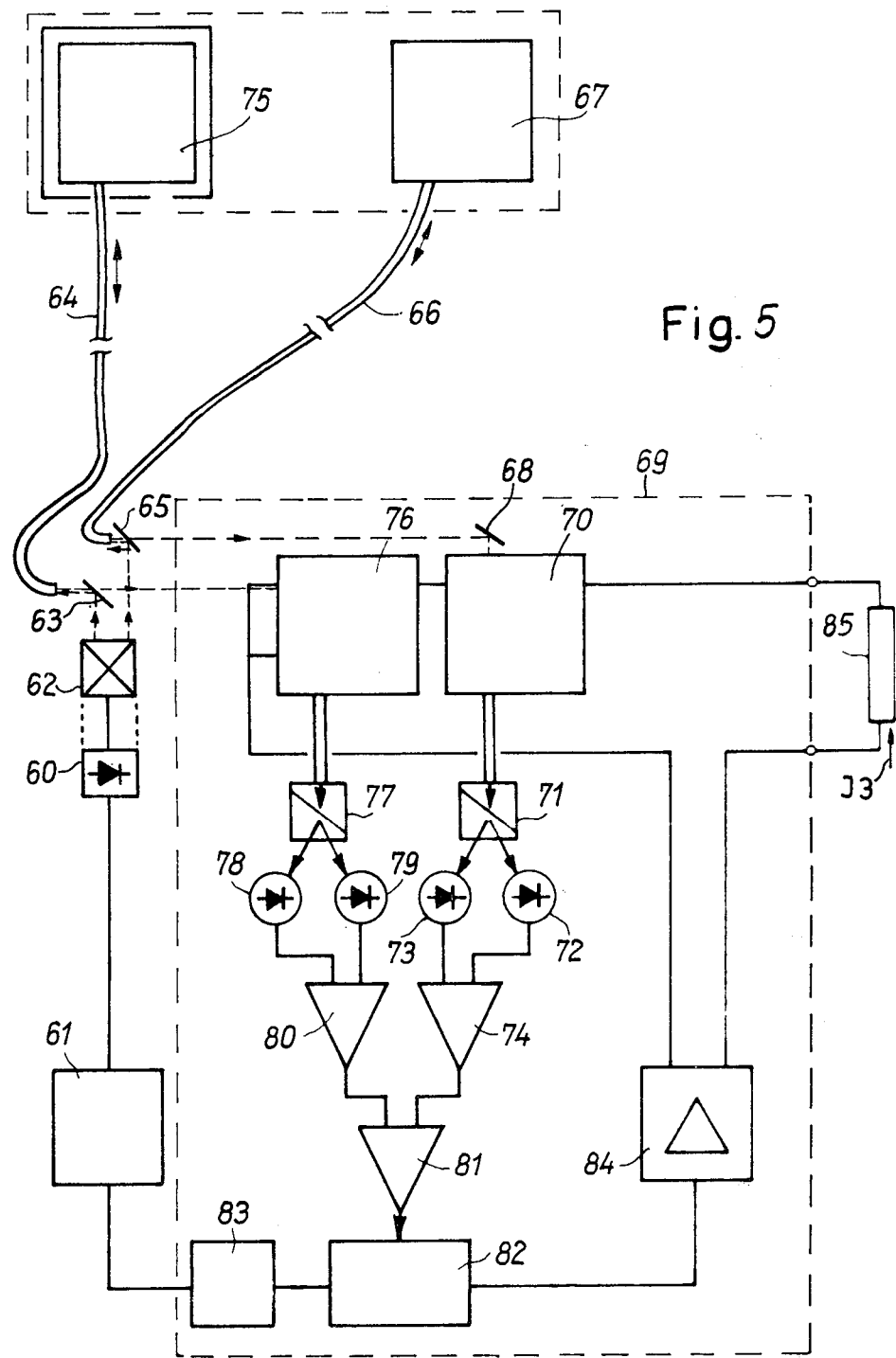
FIG. 5 is a schematic diagram of the measuring apparatus arranged to measure current and equipped with means for compensating for the effects of temperature.

In the embodiment of FIG. 5, linearly polarized light is emitted by a laser diode 60, which is controlled by a pulse generator 61. The laser diode 60 is followed by a beam splitter 62, from which light gets via a semitransparent plate 63 to a light-wave conductor 64, and via a further semitransparent plate 65, to a further light-wave conductor 66. Polarized light in the form of light pulses is transmitted via the light-wave conductor 66 to a coil shown schematically at 64 and having a configuration which is identical with the coil 33 according to FIG. 3. In the coil 67, the plane of polarization of the light fed to it is rotated as a function of the magnitude of the current to be measured and the light modulated in this manner, after reflection at the end of the coil, is conducted via the further light guide 66 and the deflecting mirror 68 to the evaluator device 69.

In the evaluator device 69 the arriving light is fed to a magneto-optical modulator 70, which may be constructed as shown in FIG. 4. The magneto-optical modulator 70 is followed by an analyzer prism 71, to which, as already shown in FIG. 3, photo-diodes 72 and 73 are connected; these photo-diodes 72 and 73 feed a differential amplifier 74.

In order to eliminate temperature influences on the measurement result, the device contains a shielded reference winding 75 consisting of a light-wave conductor to which polarized light from the laser diode 60 is fed via the light guide 64. In the reference winding 75, which is preferably always exposed to the same temperature as the coil 67, the polarized light is given a rotation of its plane of polarization, depending on the temperature. The light modulated in this manner is transmitted via the light-wave conductor 64, after reflection at the end of the reference winding 75, to an additional magneto-optical modulator 76 in the evaluator device 69. The additional magneto-optical modulator 76 is followed by a further analyzer prism 77, in which the light fed to it is split into two light beams, which fall onto two photo-diodes 78 and 79. A further differential amplifier 80 is connected to the photo-diodes 78 and 79.

For compensating temperature influences, both differential amplifiers 74 and 80 are connected an additional differential amplifier 81, which is followed by a synchronous demodulator 82. This synchronous demodulator is connected to the pulse generator 61 via a phase shifter 83, so that demodulation of the measuring quantity can be performed in the synchronous demodulator 82.

To the synchronous demodulator 82 is connected an output amplifer 84, which, via a load 85, feeds the magneto-optical modulators 70 and 76 with such a current that in the modulators the plane of polarization of the light modulated on the high-voltage side is rotated back. The current flowing through the load 85 is then, independently of any temperature variations, proportional to the current to be measured.

Figure 6:
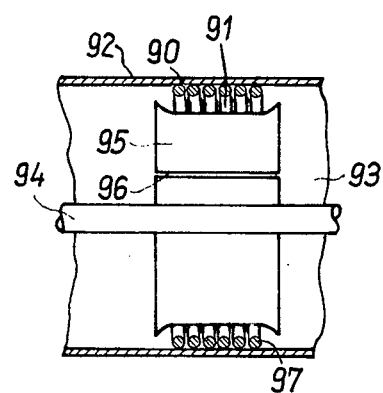
FIG. 6 illustrates the measuring sensor of a measuring apparatus of the invention adapted for making measurements in high-voltage metal-clad switching installations.

In FIG. 6, the construction of the measuring device according to the invention is shown in part for the case that currents in high-voltage conductors are to be measured in completely insulated, metal-clad high-voltage switching installations. To avoid repetition, only the construction of the coil of lightwave conductor in the swichting installation is reproduced in FIG. 6; a drawing and description of the remaining parts of the measuring device according to the invention, which can, for instance, be constructed as shown in FIGS. 3 to 5, has therefore been omitted.

As may be seen in FIG. 6, the individual turns 90 of the coil 91 are arranged at the inside surface of the outer tube 92 of the high-voltage switching installation 93 in the circumferential direction. On their inside, which faces the high-voltage conductor 94, the winding made of a light-wave conductor is provided with a shield 95, which is provided with a slot 96 to avoid a short-circuited turn. The shield 95 ensures that the electric field component in the high-voltage switching system 93 can have no effect on the light in the turns 90, but that only the magnetic field component acts in the longitudinal direction on the light-wave conductor, and that it therewith rotates the linearly polarized light conducted in this light-wave conductor as to its plane of polarization as a function of the magnitude of the current in the high-voltage conductor 94. The coil 97 is provided at one end with a mirror surface 97.

In evaluator circuits, such as have already been explained in detail in connection with the description of FIGS. 3 to 5, the rotation of the plane of polarization is converted into a current, which is proportional to the current to be measured in the high-voltage conductor 94. To eliminate temperature effects, a reference winding, with which circuit elements in the evaluator device are associated as shown in FIG. 5, can also be provided in a measuring device according to FIG. 6.

Figure 7:
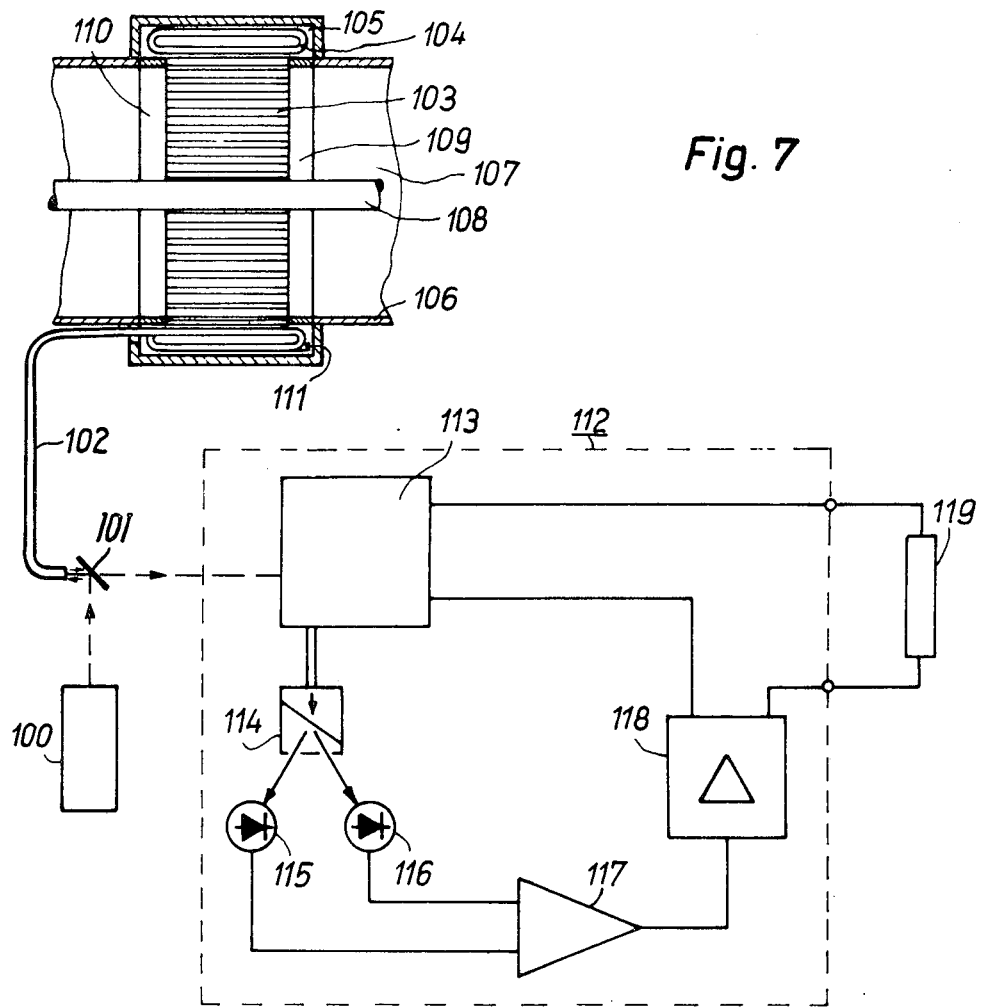
FIG. 7 illustrates an embodiment of the measuring apparatus of the invention adapted for measuring voltage on a high-voltage conductor arranged in a high-voltage metal-clad switching installation. Also shown in this view is a block-schematic diagram of the corresponding evaluation device.

In the embodiment of the invention for measuring voltages on high-voltage conductors shown in FIG. 7, linearly polarized light is emitted by a light source 100, which may be a laser. The polarized light is transmitted via a semitransparent plate 101 and a light-wave conductor 102, for example, to a toroidal coil 103, which is wound of a light-wave conductor 104.

In the measuring device shown, the toroidal coil 103 is located in a circular enlargement 105 of an outer tube 106 of a high-voltage switching installation 107. Inside the outer tube 106, a high-voltage conductor 108 is supported. The current, carried by conductor 108, produces a rotary magnetic field inside the outer tube 106 of the high-voltage installation 107. To prevent the light-wave conductor 104 of the toroidal coil 103 from being influenced by the lines of force of the magnetic field, the circular enlargement 105 is partially covered up at both end faces by shielding rings 109 and 110. The electric field, however, can act on the light-wave conductor 104 of the toroidal coil 103, and does so in the transversal direction. As a consequence, the plane of polarization of the linearly polarized light passing through the light-wave conductor 104 is rotated as a function of the electric field strength and thereby, also as a function of the voltage between the high-voltage conductor 108 and the grounded outer tube 106.

After passing through the toroidal coil 103, the light is reflected at the mirror surface 111 and then goes through the toroidal coil once more. The light, with its plane of polarization rotated, is fed, through light-wave conductor 102 to an evaluator device 112 at low-voltage potential. The evaluation means 112 contains a modulator 113 for rotating the plane of polarization of the light back.

The modulator 113 is followed by an analyzer prism 114, which splits the incident light beam into two component light beams having respective polarization planes perpendicular to each other and having respective intensities that change in opposition to each other in proportion to the angle of rotation of the polarization plane of the incident beam. The component light beams are converted into electrical quantities in two photo-diodes 115 and 116 and fed to a differential amplifier 117. The differential amplifier 117 is followed by an output amplifier 118 which drives a current through a load 119 and the modulator 113 which is constructed, for instance, as a magneto-optical modulator, such that the rotation of the plane of polarization of the light which occurred in the toroidal coil 103 is cancelled. The voltage appearing across load 119 is then proportional to the voltage to be measured.

The toroidal coil 103 is advantageously made so that the end thereof that is brought out is so long that it forms the light-wave conductor 102.

The magneto-optical modulator 113 shown in FIG. 7 can be constructed in the manner shown in FIG. 4.

To eliminate temperature influences on the resulting measurement, the device contains a shielded reference winding, such as shown in FIG. 5, as well as an evaluator device, also as shown in FIG. 5.

The device shown in FIG. 8 includes an insulator 120 that is closed off at its upper end by a flat cover 121. This cover 121 carries a terminal 122 for connection to a high-voltage conductor (not shown) whereon the voltage is to be measured. The insulator 120 sits on a base 123, which has a terminal box 124; in the terminal box, an evaluator device (not shown) can be accommodated. The secondary terminals of the device are also located in the terminal box 124.

In the embodiment shown in FIG. 8, there is located inside the insulator 120 a potential control arrangement 125, in which the control electrodes 126, 127 and 128 are embedded in the form of metallic cylinders. Layers 129 and 130 made up of a light-wave conductor are arranged between the control electrodes 126 and 127 as well as between 127 and 128, respectively. The layers 129 and 130, of which there also may be several, if correspondingly more control electrodes are provided, are advantageously wound of a continuous light-wave conductor which furthermore also forms the polarized light feed line 131. Feed line 131 can extend from a light source (not shown in FIG. 8) followed by a semitransparent plate to the layers 129 and 130. The feed line 131 can further constitute the feed line to the evaluator device. The layer 130 is provided at its end with a mirror surface 132 at which the light is reflected.

As may be seen from FIG. 8, the individual layers 129 and 130 of light-wave conductor are arranged so that the lines of the electric field run perpendicularly to the light-wave conductor between the respective adjacent control electrodes 126, 127 and 128. The plane of polarization of linearly polarized light which passes through the light-wave conductor is therefore rotated as a function of the electric field strength. Because this electric field strength is proportional to the voltage to be measured, the rotation of the plane of polarization is itself proportional to the voltage to be measured. By means of an evaluator device, such as is described in detail in FIG. 3, an electrical quantity can be obtained therefrom, which is proportional to the voltage to be measured.

In the embodiment of the invention shown in FIG. 9, an insulator 140 is closed at the top by a flat cover 141. The cover 141 has a terminal 142 for the voltage to be measured. The insulator 140 rests on a base 143 having a terminal box 144. In this terminal box 144 is located, for example, the evaluator device, and in it there were also the secondary terminals, as is known from classical voltage transformers.

Within the insulator 140 is again located, as in the example of the embodiment according to FIG. 8, a potential control arrangement 145 which can for example comprise three control electrodes 146, 147 and 148. The control electrodes 146 to 148 are metallic cylinders. The covers 121 and 141 shown in FIGS. 8 and 9, respectively, are made of metal.

As may be seen in FIG. 9, a light-wave conductor 149 coming from low-voltage potential is first passed along the inside of the control electrode 148 in the direction of the axis of the potential control arrangement 145 where lines of the electric field pass transversally through the light-wave conductor. The light wave-conductor 149 is led around the upper end 150 of the control electrode 148 and passed in the opposite direction between the control electrodes 147 and 148, to the lower end of the control electrode 147. From there, the light guide 149 is again led in the opposite direction, so that it now runs along the outside of the control electrode 147 and then, between this control electrode and the control electrode 146.

The light guide 149 is provided, for example, at its end 151 with a mirror surface 152 from which the light beam is reflected and passes through the light-wave conductor once more in the opposite direction.

In this way, the plane of polarization of the light is rotated as a function of the voltage to be measured.

The combination measuring transformer shown in FIG. 10 consists essentially of a head part 160, a feedthrough arrangement 161 and a base part 162. Inside the feedthrough arrangement 161 is disposed within an insulator 163 a potential control arrangement 164. The potential control arrangement 164 comprises several control electrodes 165, 166 and 167, which constitute metallic cylinders. As the feedthrough arrangement 161 to the left in FIG. 10 shows, a light-wave conductor 168, coming from the base part 162, is first passed along the inside of the control electrode 167. Then, the light-wave conductor 168 is brought around the upper end 169 of the control electrode 167 and led to the lower end 170 of the control electrode 166 between the control electrodes 165 and 167. From there, the light-wave conductor 168 is brought, first, along the outside of the control electrode 166 and then, between the control electrode 165 and the control electrode 166. At the upper end, the light-wave conductor is provided with a mirror surface 171 whereat the light is reflected and passes once more through the light-wave conductor 168 from the end to the front.

A light-wave conductor 172 can also be arranged within the feedthrough arrangement 161 in such a manner that it forms individual turns 173, which are arranged concentrically about the longitudinal axis of the feedthrough arrangement 161. The turns 173 of the light-wave conductor 172 form several layers, which are arranged so that they lie between two respective control electrodes 165 and 166 as well as 166 and 167. The light-wave conductor 172 carries a mirror surface 174 at the upper end.

In both arrangements of the light-wave conductor 168 and 172, respectively, in the feedthrough arrangement 161, care is taken that the lines of the electric field pass transversally through the light-wave conductor so that the plane of polarization of linearly polarized light, which goes through the light-wave conductor from the base part 162, is rotated to an extent which is dependent on the electric field strength, and therefore, on the voltage at the primary conductor 175.

A lead 176 for the current measuring part 177 in the head housing 160 is furthermore provided in the feedthrough arrangement 161.

The head part 160 of the measuring transformer in accordance with the invention is shown in FIG. 10 and has a head housing 178 which is placed on the feedthrough arrangement 161. The primary conductor 175 passes through the head housing 178. Within the head housing 178 there is a conducting, circular shell 179, which is at low-voltage potential. Within this circular shell 179 is located a secondary winding 180 with an iron core as well as a winding 181 of a light-wave conductor. The ends of the secondary winding 180 as well as one end of the winding 181 of light-wave conductor are brought out to low-voltage potential through the feedthrough arrangement 161; whereas, the other end of the winding 181 has a mirror surface.

The combination measuring transformer shown in FIG. 10 permits the measurement of the current through the primary conductor 175 over a very large range of current because, due to the use of a winding 181 made of light-wave conductor, saturation phenomena cannot occur; this effect can lead to nonlinear distortion in classical current transformers.

By means of the secondary winding 180 with iron core, current measurements for accounting purposes can furthermore be carried out. Moreover, a measurement of the voltage at the primary conductor 175 can be performed by the light-wave conductor 168 or 172, respectively, within the feedthrough arrangement 161. The light source generating the linearly polarized light as well as the evaluator device for converting the rotations of the plane of polarization of the light into electrical measurement quantities are preferably located in a terminal box 182 at the base part 162 in the combination transformer according to the invention. The evaluator devices can be constructed here, for instance, in a manner such as is described in FIG. 3.

The embodiment of a measuring transformer configured in accordance with the invention is shown in FIG. 11 and consists again of a head part 190, a feedthrough arrangement 191 and a base part 192. The feedthrough arrangement 191 comprises a porcelain insulator 193, in which a potential control arrangement is located.

Except for the arrangement of a light guide 195, the head part 190 is constructed exactly like the head part 160 in the example of the embodiment according to FIG. 10. In the embodiment according to FIG. 10, the light-wave conductors 168 and 172 for the voltage measurement are located inside the feedthrough arrangement 161; whereas in the embodiment of FIG. 11, the light-wave conductor 195 is arranged, for the purpose of voltage measurement, around a circular shell 196 forming a toroidal coil. At the end 199, the light-wave conductor 195 has a mirror surface. Because the shell 196 is grounded, the voltage at the primary conductor 198, which passes through the head part 190, appears between this shell and a housing 197, and a corresponding electric field exists in the space between the shell 196 and the head housing 197. Consequently, the plane of polarization of linearly polarized light is rotated in the light-wave conductor 195 as a function of this voltage. In an evaluator device in a terminal box, not shown, at the base part 192, an electrical quantity can be obtained therefrom, which is proportional to the voltage to be measured. The current measurement part can be constructed exactly as was explained in connection with the description of FIG. 10.

In the embodiment shown in FIG. 12, a light-wave conductor 200 is run inside a potential control arrangement 201, similarly as shown already in FIG. 10, in such a manner that the plane of polarization of linearly polarized light passing through the light guide 200 is rotated to an extent proportional to the voltage at the primary conductor 202. In an evaluation device, not shown, a secondary quantity which is proportional to the voltage at the primary conductor 202, can be obtained from the light reflected at a mirror surface 203 and returned in the light-wave conductor 200.

In the embodiment according to FIG. 12, the current is measured by means of a winding 204 of a light-wave conductor 205; the primary conductor 202 passes through the winding 204, so that a magnetic field, which is proportional to the current in the primary conductor 202, goes through the light-wave conductor 205 in the longitudinal direction. The winding 204 is preferably cast-in, for instance, with silicone rubber, and is provided with a conductive outer coating 206. This outer coating 206 ensures that the winding 204 is completely shielded and is influenced only by the magnetic field. The plane of polarization of linearly polarized light, which passes through the light-wave conductor 205 of the winding 204, is therefore rotated only as a function of the magnetic field which is produced by the current through the primary conductor 202. The winding carries a mirror surface at one end.

The light-wave conductor 200 for the voltage measurement as well as the light-wave conductor 205 for the current measurement are brought to a base part 207 wherein evaluator devices, not shown, are located.

What is claimed is:

1. A measuring apparatus for measuring voltages on high-voltage conductors whereat fields are developed having an intensity indicative of the value of the high-voltage, the apparatus comprising: a sensing coil for conducting polarized light therein, said sensing coil being made from a wound light-wave conductor having respective ends; a single light-wave conductor for receiving polarized light having a polarization and for feeding the same to said sensing coil at one of said ends thereof; said sensing coil being placeable in the vicinity of the fields whereby the polarization of the polarized light is changed by an amount corresponding to the value of the voltage being measured; reflection means disposed at the other one of said ends of said sensing coil away from said single light-wave conductor for reflecting the polarized light fed to said sensing coil whereby the polarized light of changed polarization passes through said single light-wave conductor; evaluation means for translating the changed polarization into a quantity proportional to the electrical quantity being measured; an optical device arranged ahead of said single light-wave conductor for feeding the polarized light to said single light-wave conductor and for directing said polarized light of changed polarization from said single light-wave conductor to said evaluation means; and, an uncontrolled high-voltage insulator defining an axis, said sensing coil defining a longitudinal axis, said coil being arranged in said insulator so that the axis of said coil extends in the direction of the axis of said insulator, said high-voltage insulator comprising a plurality of control electrodes imbedded therein, said control electrodes being spaced one adjacent the other so as to define a region between each two mutually adjacent ones of said control electrodes, said coil being arranged in said regions.

2. The measuring apparatus of claim 1, said reflection means being a mirrored surface of said measuring sensor.

3. The measuring apparatus of claim 1, said light-wave conductor of said coil having a plurality of layers, said layers being disposed in corresponding ones of said regions.

4. The measuring apparatus of claim 1 comprising a polarized light supply means for supplying the polarized light, said supply means and said evaluation means being arranged at low-voltage potential.

5. A measuring apparatus for measuring voltages on high-voltage conductors whereat fields are developed having an intensity indicative of the value of the high-voltage, the apparatus comprising: a sensing coil for conducting polarized light therein, said sensing coil being made from a wound light-wave conductor having respective ends; a single light-wave conductor for receiving polarized light having a polarization and for feeding the same to said sensing coil at one of said ends thereof; said sensing coil being placeable in the vicinity of the fields whereby the polarization of the polarized light is changed by an amount corresponding to the value of the voltage being measured; reflection means dispoed at the other one of said ends of said sensing coil away from said single light-wave conductor for reflecting the polarized light fed to said sensing coil whereby the polarized light of changed polarization passes through said single light-wave conductor; evaluation means for translating the changed polarization into a quantity proportional to the electrical quantity being measured; an optical device arranged ahead of said single light-wave conductor for feeding the polarized light to said single light-wave conductor and for directing said polarized light of changed polarization from said single light-wave conductor to said evaluation means; and, a high-voltage insulator including a plurality of control electrodes imbedded therein, said electrodes being arranged one adjacent the other, said light-wave conductor of said sensing coil being directed along said electrodes so as to pass between each two mutually adjacent ones of said control electrodes.

6. The measuring apparatus of claim 5, said light-wave conductor of said sensing coil being configured so as to constitute a plurality of toroidal coils connected one to the other, said coils surrounding corresponding ones of said control electrodes.

7. The measuring apparatus of claim 5 comprising a polarized light supply meams for supplying the polarized light, said supply means and said evaluation means being arranged at low-voltage potential.

8. A measuring apparatus for measuring voltages on high-voltage conductors whereat fields are developed having an intensity indicative of the value of the high-voltage, the apparatus comprising: a sensing coil for conducting polarized light therein, said sensing coil being made from a wound light-wave conductor having respective ends; a single light-wave conductor for receiving polarized light having a polarization and for feeding the same to said sensing coil at one of said ends thereof; said sensing coil being placeable in the vicinity of the fields whereby the polarization of the polarized light is changed by an amount corresponding to the value of the voltage being measured; reflection means disposed at the other one of said ends of said sensing coil away from said single light-wave conductor for reflecting the polarized light fed to said sensing coil whereby the polarized light of changed polarization passes through said single light-wave conductor; evaluation means for translating the changed polarization into a quantity proportional to the electrical quantity being measured; an optical device arranged ahead of said single light-wave conductor for feeding the polarized light to said single light-wave conductor and for directing said polarized light of changed polarization from said single light-wave conductor to said evaluation means; and, a high-voltage insulator including voltage control elements in the form of wound capacitors, said light-wave conductor of said sensing element being configured to be a plurality of interconnected component coils wound into said capacitors.

9. A measuring apparatus for measuring voltages on high-voltage conductors whereat fields are developed having an intensity indicative of the value of the high-voltage, the apparatus comprising: a sensing coil for conducting polarized light therein, said sensing coil being made from a wound light-wave conductor having respective ends; a single light-wave conductor for receiving polarized light having a polarization and for feeding the same to said sensing coil at one of said ends thereof; said sensing coil being placeable in the vicinity of the fields whereby the polarization of the polarized light is changed by an amount corresponding to the value of the voltage being measured; reflection means disposed at the other one of said ends of said sensing coil away from said single light-wave conductor for reflecting the polarized light fed to said sensing coil whereby the polarized light of changed polarization passes through said single light-wave conductor; evaluation means for translating the changed polarization into a quantity proportional to the electrical quantity being measured; an optical device arranged ahead of said single light-wave conductor for feeding the polarized light to said single light-wave conductor and for directing said polarized light of changed polarization from said single light-wave conductor to said evaluation means; and, a high-voltage insulator including a plurality of plate capacitors having respective electrodes, said light-wave conductor of said sensing coil being arranged between mutually adjacent ones of said electrodes.

10. A measuring apparatus for measuring voltages on high-voltage conductors whereat fields are developed having an intensity indicative of the value of the high-voltage, the apparatus comprising: a sensing coil for conducting polarized light therein, said sensing coil being made from a wound light-wave conductor having respective ends; a single light-wave conductor for receiving polarized light having a polarization and for feeding the same to said sensing coil at one of said ends thereof; said sensing coil being placeable in the vicinity of the fields whereby the polarization of the polarized light is changed by an amount corresponding to the value of the voltage being measured; reflection means disposed at the other one of said ends of said sensing coil away from said single light-wave conductor for reflecting the polarized light fed to said sensing coil whereby the polarized light of changed polarization passes through said single light-wave conductor; evaluation means for translating the changed polarization into a quantity proportional to the electrical quantity being measured; an optical device arranged ahead of said single light-wave conductor for feeding the polarized light to said single light-wave conductor and for directing said polarized light of changed polarization from said single light-wave conductor to said evaluation means; and, a high-voltage insulator including a plurality of dish capacitors having respective electrodes, said light-wave conductor of said sensing coil being arranged between mutually adjacent ones of said electrodes.

11. A measuring apparatus for measuring voltages on high-voltage conductors whereat fields are developed having an intensity indicative of the value of the high-voltage, the apparatus comprising: a sensing coil for conducting polarized light therein, said sensing coil being made from a wound light-wave conductor having respective ends; a single light-wave conductor for receiving polarized light having a polarization and for feeding the same to said sensing coil at one of said ends thereof; said sensing coil being placeable in the vicinity of the fields whereby the polarization of the polarized light is changed by an amount corresponding to the value of the voltage being measured; reflection means disposed at the other one of said ends of said sensing coil away from said single light-wave conductor for reflecting the polarized light fed to said sensing coil whereby the polarized light of changed polarization passes through said single light-wave conductor; evaluation means for translating the changed polarization into a quantity proportional to the electrical quantity being measured; an optical device arranged ahead of said single light-wave conductor for feeding the polarized light to said single light-wave conductor and for directing said polarized light of changed polarization from said single light-wave conductor to said evaluation means; and, a current measuring unit for measuring the current in the high-voltage conductor and having a current sensing part; a feedthrough arrangement arranged with respect to the high-voltage conductor so as to establish the electric field therein caused by the voltage on the line; and, a housing mounted on said feedthrough arrangement, said housing being configured for receiving the high-voltage conductor and for containing said current sensing part therein; said light-wave conductor of said sensing coil being arranged in said field in said feedthrough arrangement so as to cause the polarized light passing through the same to experience a rotation of its polarization plane by an amount indicative of the voltage on the high-voltage conductor.

12. The measuring apparatus of claim 11, said feedthrough arrangement having an axis, said light-wave conductor of said sensing coil defining a longitudinal axis, said coil being disposed in said feed-through arrangement so that the axis of said coil extends in the same direction as said axis of said feedthrough arrangement.

13. The measuring apparatus of claim 11, said feedthrough arrangement comprising a plurality of control electrodes imbedded therein, said control electrodes being spaced one adjacent the other so as to define a region between each two mutually adjacent ones of said control electrodes, said light-wave conductor of said sensing coil being configured as a coil arranged in said regions.

14. The measuring apparatus of claim 13, the light-wave conductor of said coil being wound into a plurality of layers, said layers being disposed in corresponding ones of said regions.

15. The measuring apparatus of claim 11, said feedthrough arrangement having a plurality of control electrodes imbedded therein, said electrodes being arranged one adjacent the other, said light-wave conductor of said sensing coil being directed along said electrodes so as to pass between each two mutually adjacent ones of said control electrodes.

16. The control apparatus of claim 15, said light-wave conductor of said sensing coil being configured so as to constitute a plurality of toroidal coils connected one to the other, said coils being would upon corresponding ones of said control electrodes.

17. The measuring apparatus of claim 11, said feedthrough arrangement including voltage control elements in the form of wound capacitors, said light-wave conductor of said sensing coil being configured to be a plurality of interconnected component coils wound into said capacitors.

18. The measuring apparatus of claim 11, said feedthrough arrangement including a plurality of plate capacitors having respective electrodes, said light-wave conductor of said sensing coil being arranged between mutually adjacent ones of said electrodes.

19. The measuring apparatus of claim 11, said feedthrough arrangement including a plurality of dish capacitors having respective electrodes, said light-wave conductor of said sensing coil being arranged between mutually adjacent ones of said electrodes.

20. The measuring apparatus of claim 11 comprising a polarized light supply means for supplying the polarized light, said supply means and said evaluation means being arranged at low-voltage potential.

21. The measuring apparatus of claim 11, said current measuring unit comprising a light-wave conductor wound into a coil arranged with respect to the high-voltage conductor so that the conductor passes through the coil.

22. The measuring apparatus of claim 21 comprising a polarized light supply means for supplying the polarized light, said supply means and said evaluation means being arranged at low-voltage potential.

23. A measuring apparatus for measuring voltages on high-voltage conductors whereat fields are developed having an intensity indicative of the value of the high-voltage, the apparatus comprising: a sensing coil for conducting polarized light therein, said sensing coil being made from a would light-wave conductor having respective ends; a single light-wave conductor for receiving polarized light having a polarization and for feeding the same to said sensing coil at one of said ends thereof; said sensing coil being placeable in the vicinity of the fields whereby the polarization of the polarized light is changed by an amount corresponding to the value of the voltage being measured; reflection means disposed at the other one of said ends of said sensing coil away from said single light-wave conductor for reflecting the polarized light fed to said sensing coil whereby the polarized light of changed polarization passes through said single light-wave conductor; evaluation means for translating the changed polarization into a quantity proportional to the electrical quantity being measured; an optical device arranged ahead of said single light-wave conductor for feeding the polarized light to said single light-wave conductor and for directing said polarized light of changed polarization from said single light-wave conductor to said evaluation means; and, a current measuring unit for measuring current in the high-voltage conductor and having a current sensing part; a feedthrough arrangement; and, a housing mounted on said feedthrough arrangement, said housing containing said current sensing part and being configured for receiving the high-voltage conductor therein whereby the electric field caused by the voltage on the line is established inside said housing, said light-wave conductor of said sensing coil being arranged in said field in said housing so as to cause the polarized light passing through the same to experience a rotation of its polarization plane by an amount indicative of the voltage on the high-voltage conductor.

24. The measuring apparatus of claim 23, said current measuring unit including a conductive, annular shell for receiving said current sensing part therein, said annular shell being disposed within said housing so as to define a space between said shell and said housing through which the field lines of said electric field pass, said light-wave conductor of said sensing coil being a toroidal coil having turns arranged in said space so as to cause said field lines to pass transversally therethrough.

25. The measuring apparatus of claim 23 comprising a polarized light supply means for supplying the polarized light, said supply means and said evaluation means being arranged at low-voltage potential.

26. The measuring apparatus of claim 23, said current measuring unit comprising a light-wave conductor wound into a coil arranged with respect to the high-voltage conductor so that the conductor passes through the coil.

27. The measuring apparatus of claim 23 comprising a shell for receiving the high-voltage conductor, said shell being arranged in said housing so as to cause said housing to surround said shell, said shell and said housing conjointly defining a space through which the electric field lines of said field pass, said light-wave conductor of said sensing coil having turns arranged in said space so as to cause the electric field lines to pass transversally through the same.

28. The measuring apparatus of claim 26, said last-mentioned light-wave conductor being disposed in surrounding relation to said shell in a manner to cause the polarization plane of the polarized light passing therethrough to be rotated in dependence upon the magnitude of the current in the highvoltage conductor.

29. The measuring apparatus of claim 28 comprising a polarized light supply means for supplying the polarized light, said supply means and said evaluation means being arranged at low-voltage potential.

* * * * *

UNITED STATES PATENT AND TRADEMARK OFFICE
CERTIFICATE OF CORRECTION

PATENT NO. : 3 936 742
DATED : February 3, 1976
INVENTOR(S) : Dieter Krause

It is certified that error appears in the above-identified patent and that said Letters Patent are hereby corrected as shown below:

On Page 1 of Patent under "Foreign Priority Data"

change date from "December 11, 1972" to --December 11, 1973--

Column 5, line 10, change "of" (second occurrence) to --or--

Column 8, line 7, change "64" to --67--

Column 8, line 62, change "swichting" to --switching--

Claim 5, Column 14, line 25, change "depoed" to --disposed--.

Signed and Sealed this

Twentieth Day of July 1976

[SEAL]

Attest:

RUTH C. MASON
*Attesting Officer*

C. MARSHALL DANN
*Commissioner of Patents and Trademarks*